(12) United States Patent
Strukov et al.

(10) Patent No.: US 9,793,275 B2
(45) Date of Patent: Oct. 17, 2017

(54) MULTILAYER CIRCUIT

(75) Inventors: Dmitri Borisovich Strukov, Mountain View, CA (US); Julien Borghetti, Mountain View, CA (US)

(73) Assignee: Hewlett Packard Enterprise Development LP, Houston, TX (US)

(*) Notice: Subject to any disclaimer, the term of this patent is extended or adjusted under 35 U.S.C. 154(b) by 1175 days.

(21) Appl. No.: 13/259,177

(22) PCT Filed: Aug. 14, 2009

(86) PCT No.: PCT/US2009/053821
§ 371 (c)(1),
(2), (4) Date: Sep. 23, 2011

(87) PCT Pub. No.: WO2011/019354
PCT Pub. Date: Feb. 17, 2011

(65) Prior Publication Data
US 2012/0032345 A1 Feb. 9, 2012

(51) Int. Cl.
*H01L 23/48* (2006.01)
*H01L 29/792* (2006.01)
*H01L 23/52* (2006.01)
*H01L 21/44* (2006.01)
*H01L 27/105* (2006.01)
*H01L 27/06* (2006.01)
*H01L 27/10* (2006.01)
*H01L 27/112* (2006.01)
*H01L 27/24* (2006.01)

(52) U.S. Cl.
CPC ........ *H01L 27/105* (2013.01); *H01L 27/0688* (2013.01); *H01L 27/101* (2013.01); *H01L 27/112* (2013.01); *H01L 27/11286* (2013.01); *H01L 27/24* (2013.01)

(58) Field of Classification Search
CPC . H01L 27/105; H01L 27/0688; H01L 27/101; H01L 27/112; H01L 27/11286; H01L 27/14
USPC ......... 257/774, E27.004, 324, 758; 438/129, 438/102, 598
See application file for complete search history.

(56) References Cited

U.S. PATENT DOCUMENTS

| | | | |
|---|---|---|---|
| 6,278,148 B1 * | 8/2001 | Watanabe et al. | 257/296 |
| 6,744,139 B2 | 6/2004 | Shimizu et al. | |
| 6,906,940 B1 * | 6/2005 | Lue | 365/63 |
| 2002/0053690 A1 * | 5/2002 | Kim et al. | 257/296 |
| 2005/0136650 A1 | 6/2005 | Tsuchida | |

(Continued)

FOREIGN PATENT DOCUMENTS

| | | |
|---|---|---|
| JP | 2003-021892 | 1/2003 |
| JP | 2004-317975 | 11/2004 |
| JP | 2005-183567 | 7/2005 |

*Primary Examiner* — Dzung Tran
(74) *Attorney, Agent, or Firm* — Fabian VanCott

(57) ABSTRACT

A multilayer circuit (400) includes a base layer (205) which has a number of base vias (247, 415), a first overlying layer (215) formed on the base layer (205) and having a first routing section (210) and a second overlying layer (220) formed on the first overlying layer (215). The second overlying layer (220) has a second routing section (210) and is formed using the same set of masks. The first routing section (210) and the second routing section (210) form a unique electrical pathway (248) between a base via (247) and an element in an overlying layer. A method for forming a multilayer circuit is also provided.

20 Claims, 6 Drawing Sheets

(56) References Cited

U.S. PATENT DOCUMENTS

| | | | |
|---|---|---|---|
| 2005/0224982 A1* | 10/2005 | Kemerling et al. | 257/758 |
| 2008/0090337 A1* | 4/2008 | Williams | 438/133 |
| 2008/0173932 A1* | 7/2008 | Kidoh et al. | 257/324 |
| 2008/0265236 A1* | 10/2008 | Lee et al. | 257/3 |
| 2010/0159688 A1* | 6/2010 | Rinerson et al. | 438/598 |

* cited by examiner

MULTILAYER CIRCUIT

BACKGROUND

In the past decades, the semiconductor industry has been improving the performance and density of integrated circuits primarily by shrinking the size of the electronic elements within the circuits. However, a number of barriers are becoming evident which increase the difficulty of making further reduction to the size of these elements. One potential solution for increasing the performance and planar density of integrated circuits is to create three dimensional circuits which contain multiple layers of interconnected circuitry.

BRIEF DESCRIPTION OF THE DRAWINGS

The accompanying drawings illustrate various embodiments of the principles described herein and are a part of the specification. The illustrated embodiments are merely examples and do not limit the scope of the claims.

Throughout the drawings, identical reference numbers designate similar, but not necessarily identical, elements.

DETAILED DESCRIPTION

In the past decades, the semiconductor industry has been improving the performance and density of integrated circuits primarily by shrinking the size of the electronic elements within the circuits. However, a number of barriers are becoming evident which increase the difficulty of making further reduction to the size of these elements. One potential solution for increasing the performance and planar density of integrated circuits is to create three dimensional circuits which contain multiple layers of interconnected circuitry.

The cost and complexity of manufacturing a multilayer circuit is at least partly dependent on the number of unique masks which are used to construct the multilayer circuit. If a large number of unique masks are used, the cost of the multilayer circuit can also be high. For example, if a multilayer circuit has 100 layers and each layer requires 6 unique masks, the total number of unique masks is 600. This large number of masks can make the construction of the multilayer circuit prohibitively expensive.

One reason for using a large number of different masks to construct a multilayer circuit is that the input, output, and control signals must be uniquely routed from the underlying control circuitry to each of the layers within the multilayer circuit. For example, in a multilayer circuit which includes a number of memory layers overlying a Complimentary Metal-Oxide-Semiconductor (CMOS) control circuit, unique routing of input/output signals provides access to the desired memory layer. However, this unique routing can result in significant differences in the masks used to form the layers within the multilayer circuit. Because of these differences, a large number of masks are used to create a multilayer circuit.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

As discussed above, a conventional approach to routing connections between layers in a multilayer integrated circuit uses a large number of unique masks to form the traces between the various layers and the underlying control circuitry. This large number of masks increases the cost and complexity of manufacturing the multilayer circuit.

Figure 1:
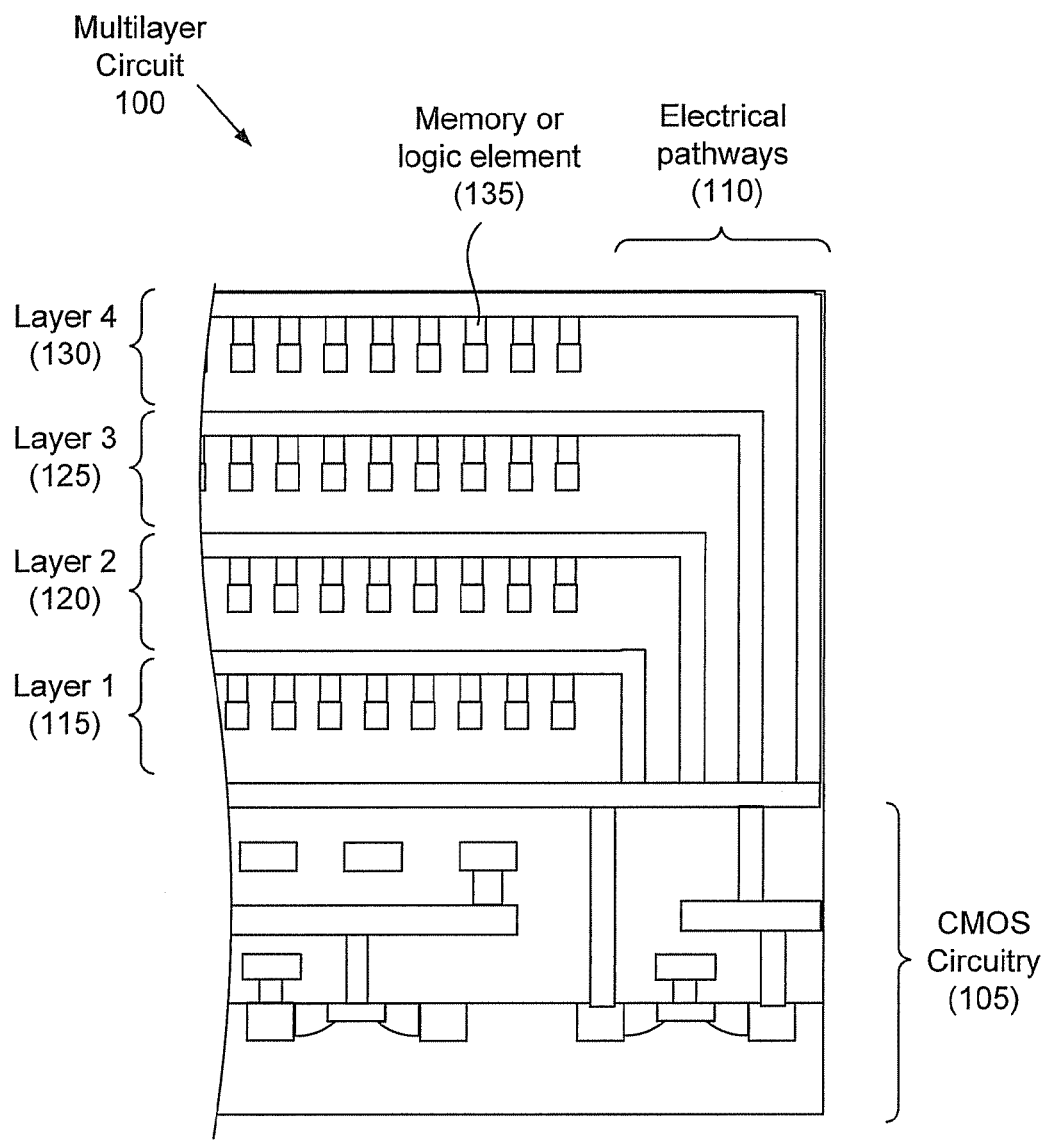
FIG. 1 is a cross-sectional diagram of an illustrative multilayer circuit, according to one embodiment of principles described herein.

FIG. 1 is a cross-sectional diagram of one illustrative embodiment of a conventional multilayer circuit (100). According to one illustrative embodiment, the conventional multilayer circuit (100) includes CMOS circuitry (105) which is connected to overlying layers (115, 120, 125, 130) by a number of electrical pathways (110) with unique geometries. The unique geometries the electrical pathways (110) are used to provide unique routing from a specific portion of the CMOS circuitry (105) to the desired location within a particular layer. However, because each electrical pathway is unique, a large number of different masks are used to form layers in the multilayer circuit (100).

It has been discovered that a number of substantially identical layers can provide unique routing for electrical pathways through a multilayer circuit. The substantially identical layers can be created using the same set of masks. Consequently, the cost and complexity of manufacturing the multilayer circuitry can be significantly reduced.

Figure 2:
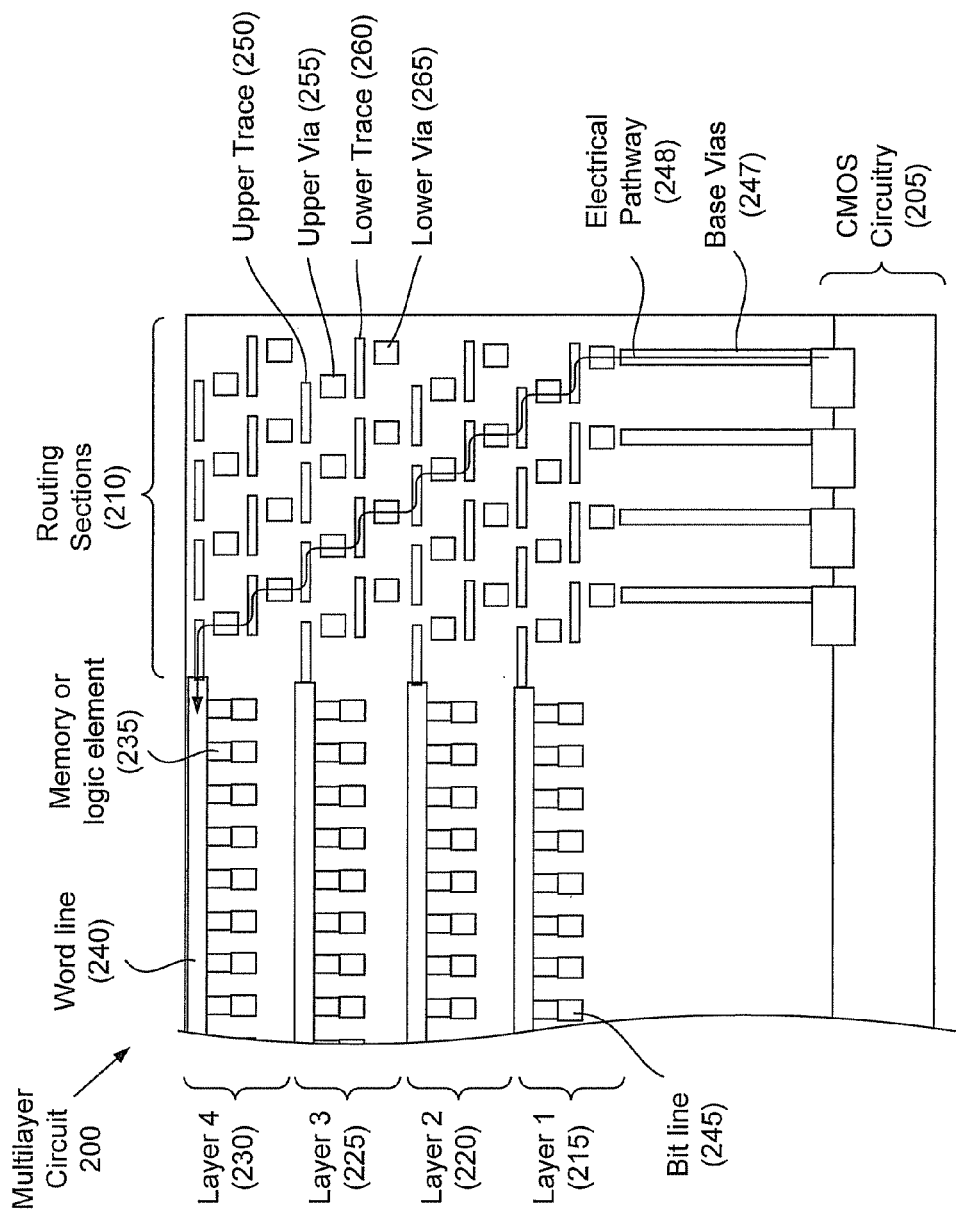
FIG. 2 is a cross-sectional diagram of an illustrative multilayer circuit which uses the same masks in each layer to generate electrical pathways which sequentially route electrical signals to each of the layers, according to one embodiment of principles described herein.

FIG. 2 is a cross-sectional diagram of an illustrative multilayer circuit (200) which substantially identical routing sections (210) in each layer (215, 220, 225, 230) to form unique electrical pathways between the CMOS circuitry (205) and appropriate elements within the layers. In this illustrative embodiment, CMOS control circuitry (205) forms the bottom most layer of the multilayer circuit (200). The CMOS control circuitry (205) may serve a number of functions, including supplying power, providing input/output functions, providing read/write functions, and other functions. Connections with the CMOS circuitry (205) are made by connecting with base vias (247) which are exposed on the upper surface of the CMOS circuitry. CMOS circuitry is only one illustrative example of control circuitry which could be used to provide functionality within a multilayer circuit.

The overlying layers (215, 220, 225, 230) are stacked over the CMOS layer (205). According to one illustrative embodiment, each of the overlying layers (215, 220, 225, 230) includes a number memory or logic elements (235). These memory or logic elements (235) are connected to word lines (240) and bit lines (245). Each of the layers (215, 220, 225, 230) also includes one or more routing sections (210). The routing sections (210) in each of the layers are identical and include a number of traces and vias which are connected to form a number of electrical pathways through the thickness of each layer. As used in the specification and appended claims, the term "via" is used to indicate a conductive element which passes vertically through a portion of a circuit. The term "trace" refers to a conductive element which passes laterally through a portion of a circuit. The combination of vias and traces provides both vertical and lateral routing of electrical connections. As used in the specification and appended claims, the term "mask" refers broadly to a lithographic mask, a nanoimpression template, a mold, or other pattern which defines one or more structures within a circuit.

According to one illustrative embodiment, the traces and vias offset an incoming electrical path to a new location on the opposite side of the layer. For example, these electrical pathways may be formed by the electrical interconnection between a lower via (265), a lower trace (260), an upper via (255), and an upper trace (250). In one implementation, the lower trace and upper trace are linear conductive elements which laterally translate the electrical pathway (248) in the same direction. For example, the bottom side of the lower via (265) in layer 3 (225) connects to an underlying upper trace in layer 2 (220). The top side of the lower via (265) connects to a lower trace (260) which laterally shifts the electrical connection toward the wordlines. Similarly, the upper via (255) is sandwiched between lower trace (260) and the upper trace (250). The upper trace (250), in turn connects to the lower via in layer 4 (230). Thus, the upper trace in a first layer can be electrically connected to the lower via of a second overlying layer. This illustrative configuration produces a "stair step" signal path (248) which moves from a via connected to a CMOS circuit element upward and to the left to make a connection with a word line (240) in layer 4 (230).

As can be seen from FIG. 2, each of the layers (215, 220, 225, 230) is substantially identical and could each be made using the same set of masks. For example, a first mask may be used to form lower vias (265) and a second mask may be used to form the lower traces (260) and bit lines (245). A third mask may be used to form the upper vias (255) and memory or logic element (235). A fourth mask may be used to form the upper trace (250) and word lines (240). This set of four masks could be sequentially used to form each overlying layer.

FIG. 2 and description above are intended only to illustrate one simple embodiment of a multilayer circuit (200). This description is not intended to be exhaustive or to limit these principles to any precise form disclosed. Many modifications and variations are possible in light of the above teaching. For example, the structure of the layers, the number of layers, and routing in some multilayer circuits may be significantly more complex and may require more masks and interconnections than the illustrated embodiment.

According to one illustrative embodiment, the overlying layers (215, 220, 225, 230) illustrated in FIG. 2 may be crossbar arrays which an illustrative crossbar array (300). The crossbar array (300) includes a first group of read/write/control lines (306) which are generally parallel. According to one illustrative embodiment, a second group of read/write/control lines (308) are perpendicular to and intersect the first group of lines (306). However, the first and second groups of lines (306, 308) may intersect at any nonzero angle. According to one illustrative embodiment, programmable crosspoint devices (310) are formed at the intersection between an upper line (302) and lower line (304).

According to one illustrative embodiment, the programmable crosspoint devices (310) are memristive devices or memcapacitive devices. Memristive devices exhibit a "memory" of past electrical conditions. For example, a memristive device may include a matrix material which contains mobile dopants. These dopants can be moved within a matrix to dynamically alter the electrical operation of an electrical device. The motion of dopants can be induced by the application of a programming electrical voltage across a suitable matrix. The programming voltage generates a relatively high electrical field through the memristive matrix and alters the distribution of dopants. After removal of the electrical field, the location and characteristics of the dopants remain stable until the application of another programming electrical field. These changing dopant configurations within a matrix produce changes in the electrical resistance or other characteristics of the device. The memristive device is read by applying a lower reading voltage which allows the internal electrical resistance of the memristive device to be sensed but does not generate a high enough electrical field to cause significant dopant motion. Consequently, the state of the memristive device may remain stable over long time periods and through multiple read cycles. Memristive devices are described in U.S. Patent App. Pub. No. 2008/0079029, entitled "Multi-terminal Electrically Actuated Switch" and U.S. Patent App. Pub. No. 2008/0090337, entitled "Electrically Actuated Switch", both to R. Stanley Williams, which are hereby incorporated in their entirety.

Additionally or alternatively, the programmable crosspoint devices may be memcapacitive devices. According to one illustrative embodiment, memcapacitive devices share operational similarities with memristors, except the motion of dopants within the matrix primarily alters the capacitance of the device rather than its resistance. Various illustrative embodiments of memcapacitive devices are described in PCT Application No. PCT/US2009/047164 to Dmitri Strukov et al., entitled "Capacitive Crossbar Arrays" filed Jun. 12, 2009, which is incorporated by reference in its entirety.

Figure 3:
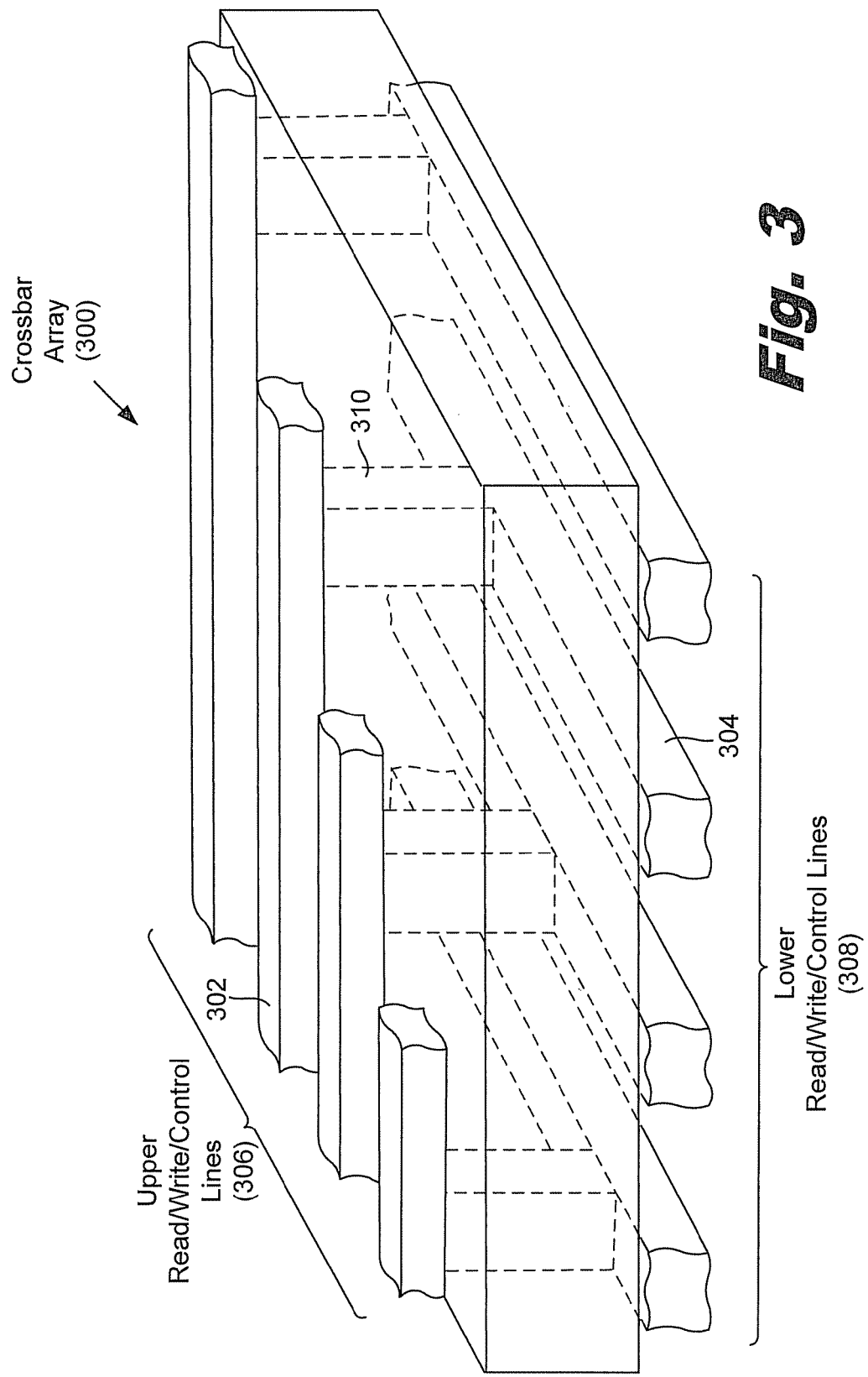
FIG. 3 is a perspective view of an illustrative crossbar array, according to one embodiment of principles described herein.

According to one illustrative embodiment, the nanowire crossbar architecture (200) may be used to form a nonvolatile memory array. Each of the programmable crosspoint devices (210) may be used to represent one or more bits of data. Although individual nanowires (202, 204) in FIG. 3 are shown with rectangular cross sections, nanowires can also have square, circular, elliptical, or more complex cross sections. The nanowires may also have many different widths or diameters and aspect ratios or eccentricities. The term "nanowire crossbar" may refer to crossbars having one or more layers of sub-microscale wires, microscale wires, or wires with larger dimensions, in addition to nanowires.

According to one illustrative embodiment, a crossbar memory array or other memristive device is integrated into complimentary metal-oxide-semiconductor (CMOS) or other conventional computer circuitry. This CMOS circuitry can provide additional functionality to the memristive device such as input/output functions, buffering, logic, or other functionality. Multiple crossbar arrays can be formed over the CMOS circuitry to create a multilayer circuit. Various three dimensional circuits which include integrated crossbar arrays are described in PCT Application No. PCT/US2009/039666, to Dmitri Strukov et al., entitled "Three Dimensional Multilayer Circuit," filed Apr. 6, 2009, which is incorporated by reference in its entirety.

Figure 4:
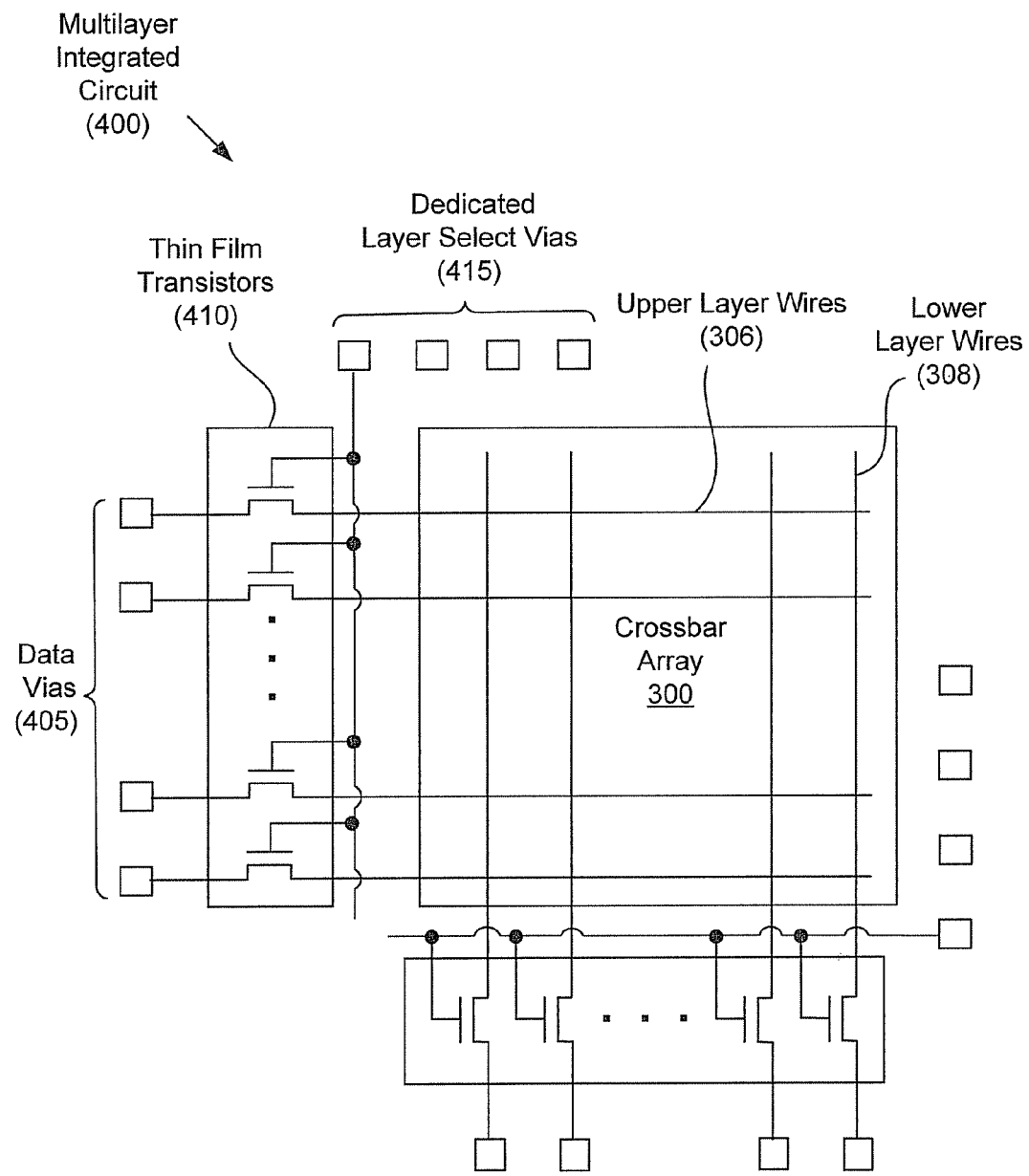
FIG. 4 is a top view of an illustrative multilayer circuit which includes a crossbar array and supporting circuitry, according to one embodiment of principles described herein.

FIG. 4 is a top view of a multilayer circuit (400) which includes a crossbar array (300) and supporting circuitry. According to one illustrative embodiment, a number of data vias (405) pass vertically through all crossbar arrays included in the multilayer integrated circuit (400). These data vias (405) are connected to every crossbar array in multilayer integrated circuit (400) through thin film transistors (410). Without a voltage applied to the gates of the thin film transistors (410), there is no electrical communication between the data vias (405) and the crossbar array. The bank of thin film transistors (410) is selectively activated by passing an electrical signal through an appropriate dedicated layer select via (415). According to one illustrative embodiment, the layer select vias (415) are routed through the multilayer circuit using routing sections which are identical in each layer. The electrical signal from the layer select via is connected to the gates of a bank of thin film transistors (410). The voltage applied to the gates of the thin film transistors (410) connects the data vias (405) to the upper layer wires (306) of the crossbar array (300). A similar operation is performed to connect data vias to the lower layer wires (308).

One limitation of thin film transistors is that they have relatively low electron mobility, and consequently have low saturation current. However, when highly resistive or memcapacitive crosspoint devices are used, the crosspoint devices become the current limiting element rather than the thin film transistors. This allows for practical decoding using thin film transistor technology.

Figure 5:
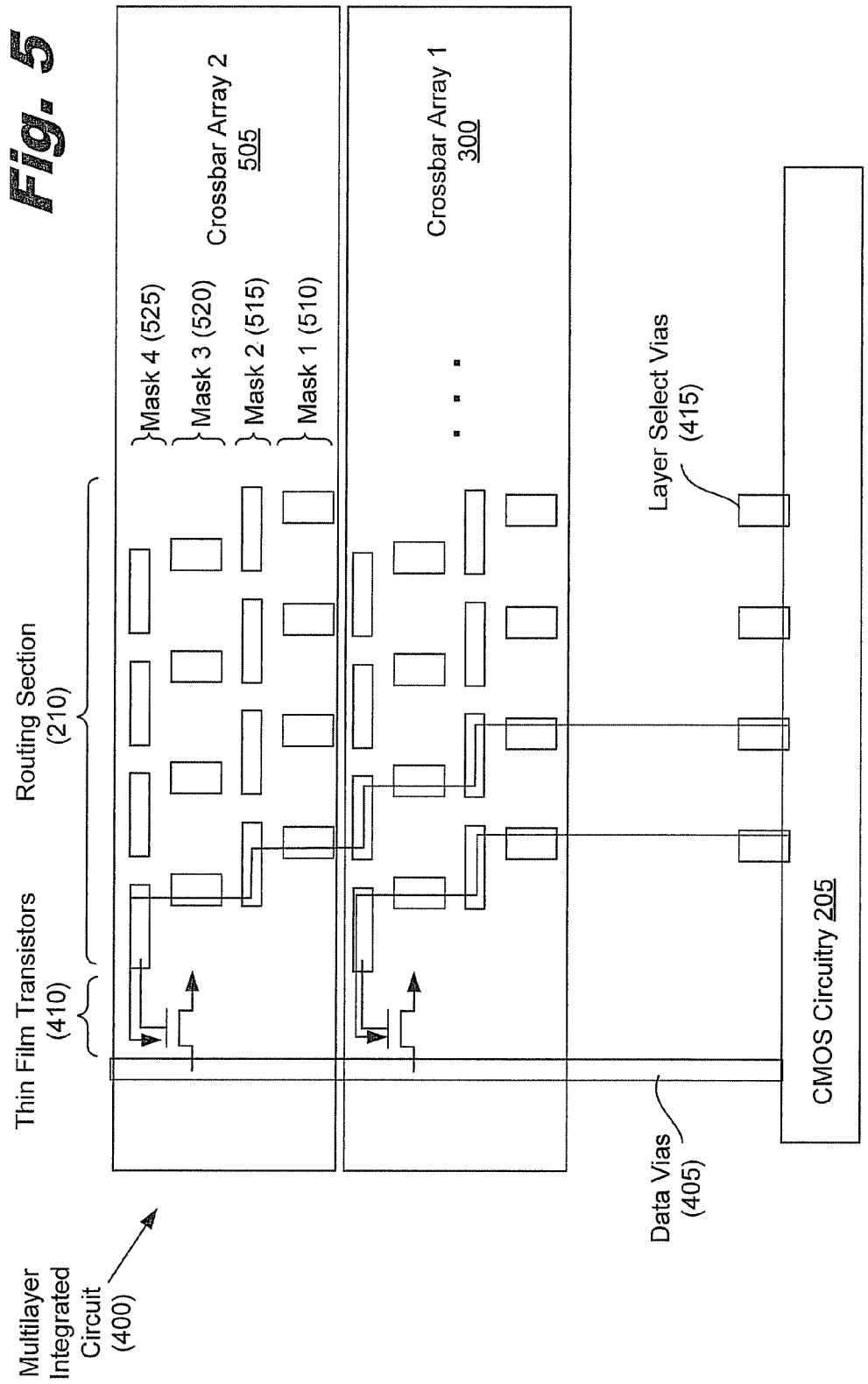
FIG. 5 is a cross-sectional view of an illustrative multilayer integrated circuit which shows the routing of electrical pathways through the layers, according to one embodiment of principles described herein.

FIG. 5 is a cross-sectional view of a multilayer integrated circuit (400) which shows the routing of the layer select vias through a multilayer circuit (400). As described above, the data vias (405) pass upward from the CMOS circuitry (205). As discussed above, the unique electrical routing of the layer select signals can be accomplished using substantially identical layers (300, 505). Because the layers (300, 505) are substantially identical, each of the layers can be created using the same set of masks.

According to one illustrative embodiment, the electrical connections are formed by connecting a number of traces and vias which sequentially move upward and laterally through the layers of the multilayer circuit (400). For clarity of illustration the various vias and traces which make up the electrical connections are shown as discrete and separated elements. However, the vias and traces are electrically and physically connected. When the electrical connection moves upward through the layers and laterally to the edge of the routing section (210), it is connected to the thin film transistors (410) which control the connection of the data vias (405). The appropriate electrical signals can then be sent from the layer select vias (415) to the gates of the thin film transistors (410). According to one illustrative embodiment, when data vias (405) are connected to both the upper and lower crossbars of a given crossbar array, data can be read or written to programmable crosspoint devices within the crossbar array.

According to one illustrative embodiment, the forming of the routing section (210) in each of the layers would only require a limited number of masks (510, 515, 520, 525). For example, the lower vias could be formed using mask 1 (510), the lower traces could be formed using mask 2 (515), the upper vias could be formed using mask 3 (520), and the upper vias could be formed using mask 4 (525). Depending on the complexity of the other circuitry in layer, the number of masks which are needed to create the routing section of the layer may or may not be the limiting factor in the number of masks used to create the layer. For simpler architectures, such as crossbar arrays, the number of masks could be relatively low. For example, mask 1 (510) could simultaneously form the lower vias in the routing section, lower crossbar wires in the crossbar array, and form a conduction path to and from the thin film transistors (410). Similarly, other masks (515, 520, 525) could also be used to form structures which are distributed over the surface area of the layer (505).

The CMOS layer (205) and/or layer select vias (415) may be either "area distributed" or "peripherally distributed." Area distributed CMOS circuitry typically contacts the target circuitry over its bottom surface. In peripherally distributed CMOS circuitry, the density at which the CMOS circuitry can be packed around the target circuit can become a limiting factor in the circuit layout. Additionally, peripherally distributed CMOS circuitry can produce a combined circuit which occupies a large planar area, with long control and input/output lines. This leads to large values of line capacitance and resistance, which makes the write and read functions slow and energy intensive.

In contrast, area distributed CMOS circuitry typically underlies the target circuitry and can occupy as much room as the target circuit without increasing the required planar area of the combined circuit. Additionally, by connecting the CMOS circuitry to the overlying target circuit using vias, long connection traces are avoid. By avoiding long connection traces which are inherent in peripherally distributed configurations, the planar size and line capacitances of the circuit can be minimized.

The illustrative routing technique illustrated in FIG. 5 can be used for both peripherally distributed and area distributed control circuitry. If the control circuitry is peripherally distributed, the routing sections for the various control lines (210) can be formed around the perimeter of the layers. For area distributed control circuitry, the routing sections may be either dispersed over each layer or may reside on the perimeter of each layer.

Figure 6:
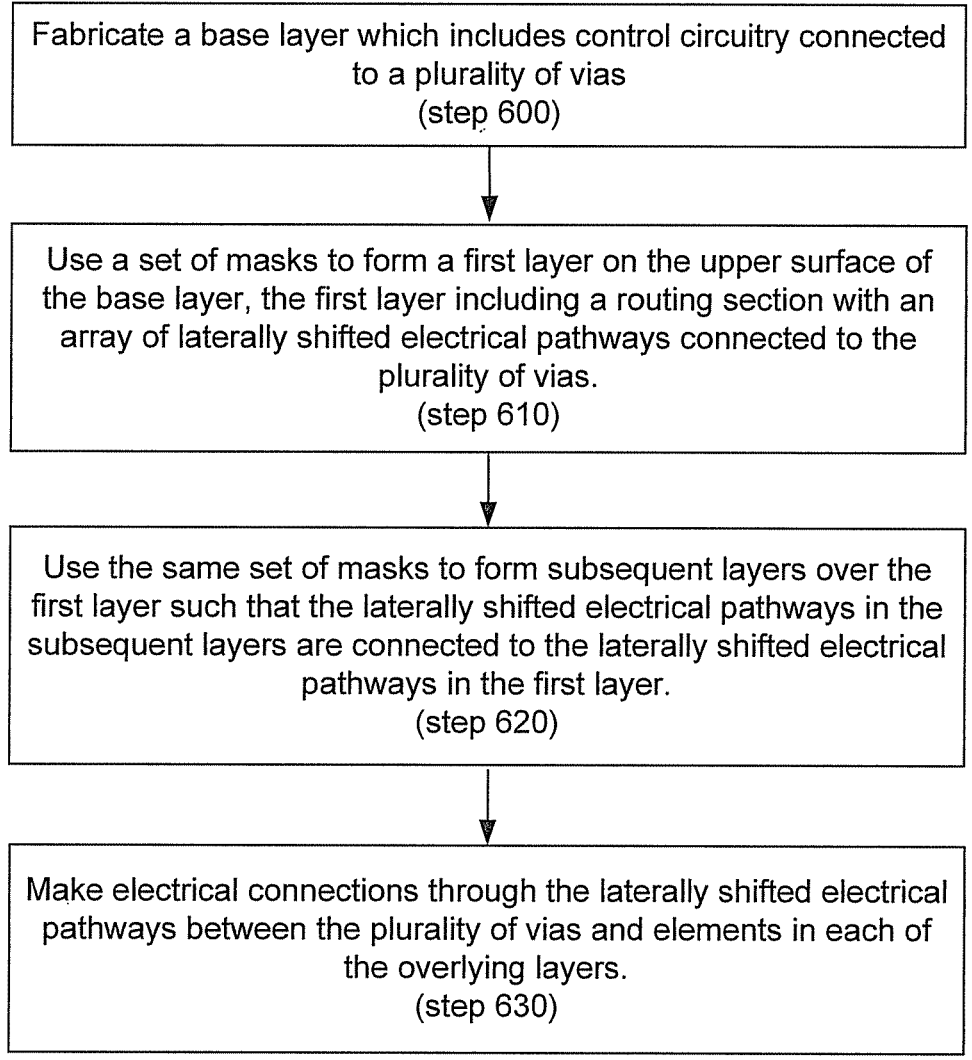
FIG. 6 is a flowchart of an illustrative method for forming a multilayer integrated circuit, according to one embodiment of principles described herein.

FIG. 6 is a flowchart describing an illustrative method for forming a multilayer integrated circuit. A first step includes forming a base layer which includes control circuitry connected to a plurality of vias (step 600). According to one illustrative embodiment, base layer includes CMOS control circuitry. The plurality of vias is exposed on the upper surface of the base layer. Using a set of masks, a first layer is formed on the upper surface of the base layer (step 610). The first layer includes a routing section which forms an array of laterally shifted electrical pathways. These laterally shifted electrical pathways are connected to the plurality of vias exposed on the upper air face of the base layer. The same set of masks is used to form subsequent layers over the first layer such that the electrical pathways in the subsequent layers are connected to the laterally shifted electrical pathways in the first layer (step 620). As the formation of the multilayer circuit proceeds, the laterally shifted electrical pathways make connections between the plurality of vias and elements in each of the overlying layers (step 630).

In sum, unique electrical pathways through a multilayer circuit can be formed using routing sections within each layer which are substantially identical. Consequently, the routing sections for each layer can be formed using the same masks or templates. This can significantly reduce the complexity and cost of manufacturing multilayer circuits.

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:

1. A multilayer circuit comprising,
a base layer comprising a number of base vias;
a first overlying layer formed on the base layer and having a first routing section; and
a second overlying layer formed on the first overlying layer, the second overlying layer having a second routing section; the first overlying layer and second overlying layer being formed using the same set of masks and having a substantially similar structure;
in which the first routing section and the second routing section form an electrical pathway between a base via and an element in an overlying layer.

2. The circuit according to claim 1, in which the electrical pathway travels upward and laterally through the first overlying layer and second overlying layer.

3. The circuit according to claim 2, in which the electrical pathway travels upward and laterally in a regular stepwise manner.

4. The circuit according to claim 3, in which the routing sections each comprise a lower via, a lower trace, an upper via, and an upper trace which are electrically connected to form the electrical pathway.

5. The circuit according to claim 4, in which the upper trace in a first layer is electrically connected to the lower via of the second overlying layer.

6. The circuit according to claim 4, in which the lower trace and upper trace are linear conductive elements which laterally translate the electrical pathway in the same direction.

7. The circuit according to claim 2, in which the first overlying layer and the second overlying layer each further comprise a crossbar array.

8. The circuit according to claim 7, in which the crossbar array further comprises a plurality of memristive programmable crosspoint devices.

9. The circuit according to claim 7, in which the crossbar array further comprises a plurality of memcapacitive programmable crosspoint devices.

10. The circuit according to claim 7, in which data vias are selectively connected to the crossbar array by a bank of thin film transistors.

11. The circuit according to claim 10, in which the bank of thin film transistors is controlled by a layer select signal which is transmitted along the electrical pathway.

12. The circuit according to claim 10, in which a plurality of layer select vias are sequentially connected to overlying layers through a plurality of the electrical pathways formed within the routing sections of the overlying layers.

13. The circuit according to claim 1, in which the base layer comprises peripherally distributed control circuitry, the peripherally distributed control circuitry being connected to the base vias.

14. The circuit according to claim 1, in which the base layer comprises area distributed control circuitry, area distributed control circuitry being connected to the base vias.

15. The circuit according to claim 1, in which the routing sections form a plurality of the electrical pathways between the overlying layers and the base vias.

16. The circuit of claim 1, in which the first routing section of the first overlaying layer comprises an array of identical laterally shifted electrical pathways, the array of laterally shifted electrical pathways connected to the base vias.

17. The circuit of claim 16, in which the second routing section of the second overlaying layer comprises an array of identical laterally shifted electrical pathways, the array of laterally shifted electrical pathways of the second routing section are electrically connected to the laterally shifted electrical pathways in the first routing section.

18. A method for forming the circuit of claim 1, the method comprising:
forming the base layer;
using a set of masks to form the first overlying layer on an upper surface of the base layer, in which the first routing section comprises an array of identical laterally shifted electrical pathways, the array of laterally shifted electrical pathways being connected to the plurality of base vias; and
using the same set of masks to form the second overlaying layer over the first overlying layer such that laterally shifted electrical pathways in the second overlying layer are connected to laterally shifted electrical pathways in the first overlying layer.

19. A multilayer circuit comprising,
a base layer comprising a number of base vias;
a plurality of substantially similar layers overlying the base layer, in which each of the plurality of layers form a portion of a crossbar array and a portion of a routing section for connecting the base vias to the crossbar array, in which each of the plurality of layers is formed using a set of four masks, in which a first mask defines lower vias in the routing section and a second mask defines lower traces in the routing section and bit lines in the crossbar array, a third mask defines upper vias in the routing section and memory elements in the crossbar array, and a fourth mask defines upper traces in the routing section and word lines in the crossbar array.

20. The circuit according to claim 19, in which routing section formed by the plurality of substantially similar layers forms an electrical pathway that travels upward from the base vias and laterally toward the crossbar array in a regular step wise manner.

* * * * *